United States Patent
Liao et al.

(10) Patent No.: US 11,955,501 B2
(45) Date of Patent: Apr. 9, 2024

(54) IMAGE SENSOR WITH IMPROVED LIGHT CONVERSION EFFICIENCY

(71) Applicant: TAIWAN SEMICONDUCTOR MANUFACTURING CO., LTD., Hsinchu (TW)

(72) Inventors: Shih-Yu Liao, Hsinchu (TW); Tsai-Hao Hung, Hsinchu (TW); Ying-Hsun Chen, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/805,573

(22) Filed: Jun. 6, 2022

(65) Prior Publication Data
US 2022/0310679 A1 Sep. 29, 2022

Related U.S. Application Data

(63) Continuation of application No. 16/830,966, filed on Mar. 26, 2020, now Pat. No. 11,355,544.

(51) Int. Cl.
*H01L 27/146* (2006.01)
*G01J 1/44* (2006.01)
*H04N 25/70* (2023.01)

(52) U.S. Cl.
CPC ............ *H01L 27/1464* (2013.01); *G01J 1/44* (2013.01); *H01L 27/14621* (2013.01);
(Continued)

(58) Field of Classification Search
CPC ........... H01L 27/1464; H01L 27/14621; H01L 27/14627; H01L 27/14629; H01L 27/1463;
(Continued)

(56) References Cited

U.S. PATENT DOCUMENTS 11,355,544 B2 6/2022 Liao et al.
2005/0274988 A1 12/2005 Hong
(Continued)

FOREIGN PATENT DOCUMENTS

JP 2015179836 A 10/2015
KR 10-2017-0081700 A 7/2017
(Continued)

OTHER PUBLICATIONS

Korean Written Opinion for KR Application No. 10-2020-0088151, dated Jan. 27, 2022, 7 pages.

*Primary Examiner* — Tony Ko
(74) *Attorney, Agent, or Firm* — Sterne, Kessler, Goldstein & Fox P.L.L.C.

(57) ABSTRACT

The present disclosure describes a method for the formation of mirror micro-structures on radiation-sensing regions of image sensor devices. The method includes forming an opening within a front side surface of a substrate; forming a conformal implant layer on bottom and sidewall surfaces of the opening; growing a first epitaxial layer on the bottom and the sidewall surfaces of the opening; depositing a second epitaxial layer on the first epitaxial layer to fill the opening, where the second epitaxial layer forms a radiation-sensing region. The method further includes depositing a stack on exposed surfaces of the second epitaxial layer, where the stack includes alternating pairs of a high-refractive index material layer and a low-refractive index material layer.

20 Claims, 14 Drawing Sheets

(52) U.S. Cl.
CPC .. *H01L 27/14627* (2013.01); *H01L 27/14629* (2013.01); *H01L 27/1463* (2013.01); *H01L 27/14634* (2013.01); *H01L 27/14636* (2013.01); *H01L 27/14685* (2013.01); *H04N 25/70* (2023.01); *G01J 2001/448* (2013.01)

(58) Field of Classification Search
CPC ......... H01L 27/14634; H01L 27/14636; H01L 27/14685; H01L 27/1462; H01L 27/14625; G01J 1/44; G01J 2001/448; H04N 5/369
See application file for complete search history.

(56) References Cited

U.S. PATENT DOCUMENTS

| | | |
|---|---|---|
| 2007/0108476 A1 | 5/2007 | Hong |
| 2016/0148959 A1 | 5/2016 | Cheng et al. |
| 2017/0025454 A1 | 1/2017 | Cheng et al. |
| 2018/0190698 A1 | 7/2018 | Na et al. |
| 2018/0261636 A1* | 9/2018 | Liu ................... H01L 31/1808 |
| 2018/0301875 A1 | 10/2018 | Burroughs |
| 2019/0103433 A1 | 4/2019 | Yamashita |
| 2021/0243858 A1 | 8/2021 | Nagao |
| 2021/0351221 A1 | 11/2021 | Hung |

FOREIGN PATENT DOCUMENTS

| | | |
|---|---|---|
| KR | 10-2019-0038413 A | 4/2019 |
| TW | 2017-17373 A | 5/2017 |
| TW | 2019-04042 A | 1/2019 |
| TW | 2019-16336 A | 4/2019 |

* cited by examiner

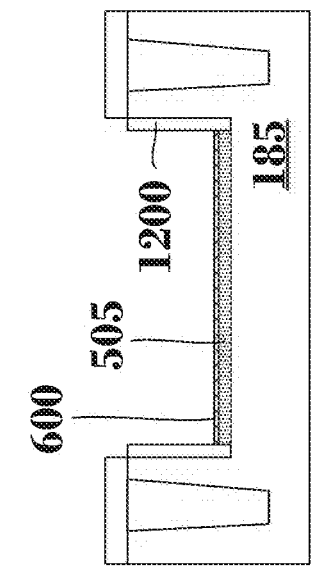
FIG. 12b
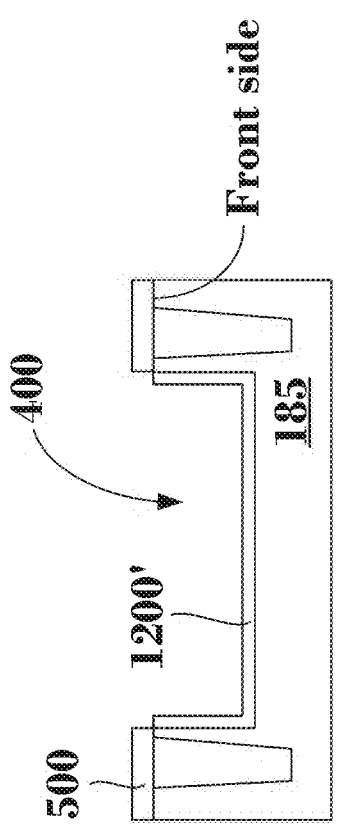
FIG. 12c
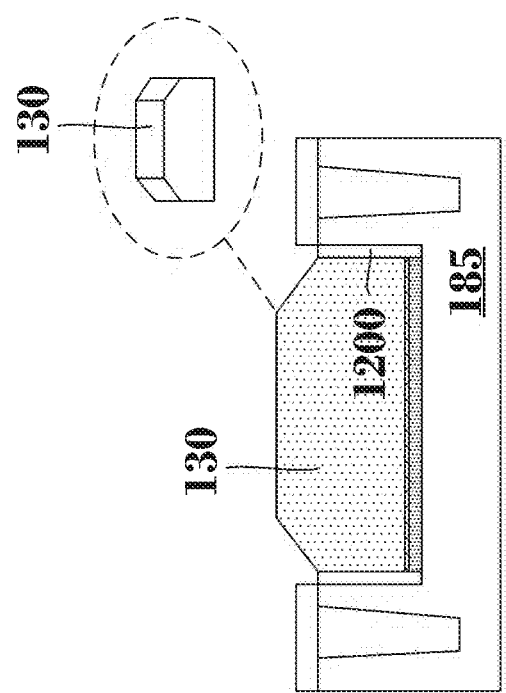
FIG. 12d
FIG. 12e

IMAGE SENSOR WITH IMPROVED LIGHT CONVERSION EFFICIENCY

CROSS-REFERENCE TO RELATED APPLICATION

This application is a continuation of U.S. Non-Provisional patent application Ser. No. 16/830,966, filed on Mar. 26, 2020, titled "Image Sensor with Improved Light Conversion Efficiency." The content of the aforementioned application is incorporated by reference herein in its entirety.

BACKGROUND

Semiconductor image sensors are used to sense incoming visible or non-visible radiation, such as visible light, infrared light, etc. Complementary metal-oxide-semiconductor (CMOS) image sensors (CIS) and charge-coupled device (CCD) sensors are used in various applications, such as computers, digital cameras, mobile phones, tablets, goggles, scientific instruments, etc. These image sensors utilize an array of pixels that absorb (e.g., sense) the incident radiation and convert it into electrical signals. An example of an image sensor is a back side illuminated (BSI) image sensor device, which detects radiation from a "back side" of a substrate.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 12b-12e are cross-sectional views of intermediate structures during the fabrication of a radiation sensing region with multiple exposed surfaces in a back side illuminated (BSI) image sensor device, in accordance with some embodiments.

DETAILED DESCRIPTION

Figure 1:
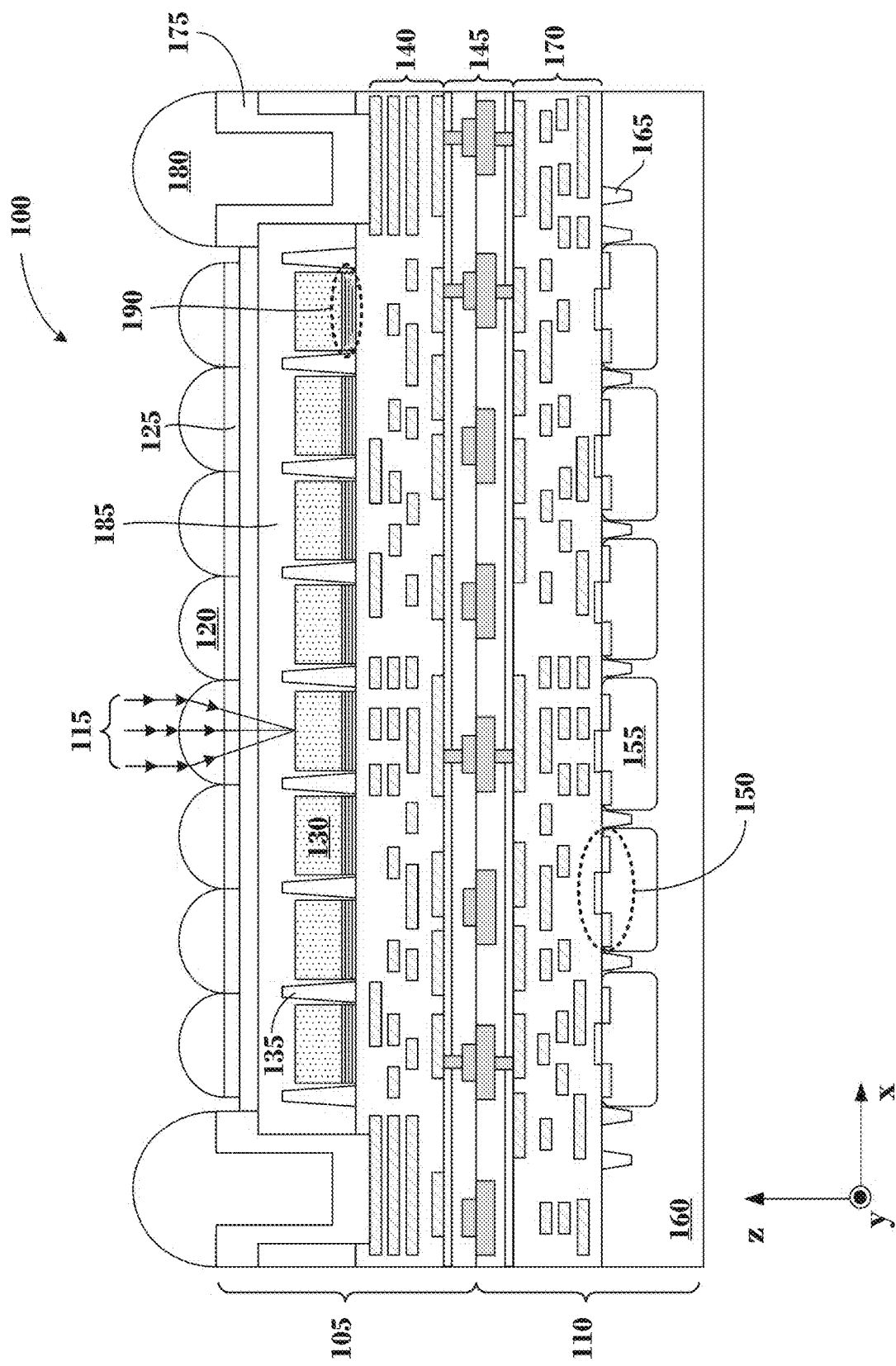
FIG. 1 a cross-sectional view of a stack with a back side illuminated (BSI) image sensor device attached to an application specific integrated circuit (ASIC), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes and/or tolerances.

In some embodiments, the terms "about" and "substantially" can indicate a value of a given quantity that varies within 5% of the value (e.g., ±1%, ±2%, ±3%, 4%, ±5% of the value). These values are merely examples and are not intended to be limiting. It is to be understood that the terms "about" and "substantially" can refer to a percentage of the values as interpreted by those skilled in relevant art(s) in light of the teachings herein.

A back side illuminated (BSI) image sensor device includes a semiconductor substrate (e.g., a silicon substrate) with an array of pixels or radiation-sensing regions formed therein. As disclosed herein, the terms "radiation-sensing regions" and "pixels" may be used interchangeably throughout. The radiation-sensing regions (pixels) are configured to convert photons from the incident radiation to electrical signal. The electrical signal is subsequently distributed to processing components attached to the BSI image sensor device. For this reason, the pixel array overlies a multilevel metallization layer configured to distribute the electrical signal generated within the radiation-sensing regions to appropriate processing components. The multilevel metallization layer is formed on a first surface of the semiconductor substrate referred to herein as the "front side" surface of the semiconductor substrate. Further, the pixel array extends into the semiconductor substrate and is configured to receive radiation from a second surface of the semiconductor substrate opposite to the front side surface of the semiconductor substrate. This second surface of the semiconductor substrate that receives the radiation (and is opposite to the front surface of the semiconductor substrate) is referred to herein as the "back side" surface of the semiconductor substrate.

Neighboring radiation sensing regions (pixels) in the semiconductor substrate are electrically isolated with isolation structures, such as deep trench isolation (DTI) structures to minimize cross talk and signal loss between the radiation-sensing regions. Aligned to the aforementioned isolation structures (and formed on the back surface of the semiconductor substrate) are respective grid structures that provide optical isolation between neighboring pixels or radiation-sensing regions. Adjacent grid structures collectively form cells, which collectively form a composite grid structure configured to receive color filtering material.

The color filtering material can be selected such that light with a desired wavelength passes through the color filtering material, while light with other wavelengths is absorbed by the color filtering material. For example, a green light color filtering material receiving unfiltered natural light would allow the green light portion (wavelengths between about 495 nm and about 570 nm) to pass through the color filter, but would absorb all the other wavelengths. The color filters are aligned to respective pixels or radiation-sensing regions to provide filtered light to the corresponding radiation-sensing regions.

By way of example and not limitation, the substrate with the radiation-sensing regions (pixels), the multilevel metallization layer, and the grid structure formed thereon can be attached via wafer bonding structures to an application specific integrated circuit (ASIC) formed on a different substrate. The ASIC can be, for example, a complementary metal oxide semiconductor (CMOS) wafer fabricated separately from the BSI image sensor device configured to perform the signal processing operations discussed above.

A challenge with BSI image sensor devices is the conversion efficiency of photons to an electrical signal. This is because not all the impinging photons from the incident radiation are converted to the electrical signal and photons that escape the radiation-sensing regions cannot be "recaptured." Therefore, BSI image sensor devices may require long radiation exposure times, large footprint, substantial signal amplification, or combinations thereof to operate under low radiation conditions.

To address the aforementioned shortcomings, the embodiments described herein are directed to a method for forming mirror micro-structures on radiation-sensing regions at the exit path of the incident radiation. In some embodiments, the mirror micro-structures are Bragg mirrors that increase the optical path of the incident radiation within the radiation-sensing regions and thus improve photon recapture. In some embodiments, the mirror micro-structure increases the optical path of the incident radiation within the radiation-sensing region and improves photon recapture. According to some embodiments, each mirror micro-structure is a Bragg mirror (or Bragg reflector) that includes a stack with alternating layer pairs of high-refractive index (high-index) and low-refractive index (low-index) material plus one layer of high-index material (2m+1); where 2m is the number of high-index and low-index pairs. The terms "high-index" and "low-index" as used herein are relative and reflect the relationship between the refractive indexes of the layers in the stack. For example, the "high-index" material has a higher refractive index than the "low-index" material. By way of example and not limitation, the stack can include between 3 and 21 layers of high-index and low-index materials formed during or after the fabrication of the radiation-sensing regions. In some embodiments, the thickness and the number of the layers in the Bragg mirror can be tailored based on the target wavelength of the incident radiation and the desired reflectivity.

FIG. 1 is a cross-sectional view of a stack 100 that includes a BSI image sensor device 105 attached to an ASIC 110, according to some embodiments. By way of example and not limitation, ASIC 110 can be configured to process the electrical signals produced by BSI image sensor device 105. In stack 100, incident radiation beams 115 enter BSI image sensor device 105 through micro-lenses 120 and color filters 125 into radiation-sensing regions or pixels 130. As discussed above, radiation-sensing regions 130 are separated by isolation structures 135. In some embodiments, radiation sensing regions 130 include a semiconductor material such as silicon (Si), germanium (Ge), or silicon germanium (SiGe) depending on the radiation wavelength of interest. For example, Si can be used for visible light applications (e.g., between about 380 nm to 740 nm) and Ge can be used for infrared applications—e.g., for wavelengths between about 940 nm and about 1550 nm, SiGe can be used for wavelengths between the visible light and the infrared. Without departing from the spirit and the scope of the disclosure, radiation-sensing regions 130 will be described in the context of Ge.

Within radiation-sensing regions 130, incident radiation beams 115 are converted to an electrical signal, which in turn is distributed by multilevel metallization layer 140 and bonding structures 145 to ASIC 110. In some embodiments, ASIC 110 is a CMOS wafer fabricated separately from the BSI image sensor device 105. By way of example and not limitation, ASIC 110 can include active devices (e.g., transistor structures) 150 formed on doped regions 155 of semiconductor (e.g., silicon) substrate 160. Further, active devices 150 are physically and electrically separated by isolation structures (e.g., shallow trench isolation structures) 165. By way of example and not limitation, arrays of active devices 150 can be used to form logic and memory circuits in ASIC 110. Electrical connections between active devices 150 and BSI image sensor device 105 are provided by a multilevel metallization layer 170 formed over active devices 150, as shown in FIG. 1. By way of example and not limitation, multilevel metallization layer 170 of ASIC 110 can be similar to multilevel metallization layer 140 of BSI image sensor device 105. However, this is not limiting and multilevel metallization layer 170 can be different from multilevel metallization layer 140. For example, multilevel metallization layer 170 may be more complex than multilevel metallization layer 140 with additional layers of wiring and a tighter pitch (e.g., shorter distance between the wiring). Multilevel metallization layers 140 and 170 are coupled through bonding structures 145 made of a metal or a metallic alloy, such as copper, aluminum-copper, aluminum-germanium, or copper-tin.

Stack 100 can be physically and electrically connected to an external device or circuit through pad structures 175 and solder bumps 180. By way of example and not limitation, pad structures 175 can be disposed at the periphery of BSI image sensor device 105 around radiation-sensing regions 130.

Without departing from the spirit and the scope of the disclosure, stack 100 can include additional components not shown in FIG. 1. These additional components are not shown in FIG. 1 for ease of illustration and can include metal wirings, active and/or passive devices, insulating layers, etch stop layers, doped regions, and other features. Further, stack 100 can be arranged differently from the way shown in FIG. 1 and can include additional or different ASCI from ASCI 110.

As shown in FIG. 1, all the elements of BSI image sensor device 105 are formed in or around substrate 185. For example, radiation-sensing regions 130 and isolation structures 135 are formed in substrate 185, While micro-lenses 120 are formed on an opposite side of substrate 185 from multilevel metallization layer 140. As referred herein, the side of substrate 185 where micro-lenses 120 are formed will also be referred to as the "back side" and the side of substrate 185 where multilevel metallization layer is formed will also be referred to as the "front side."

According to some embodiments, each radiation-sensing region 130 of BSI image sensor device 105 features a Bragg mirror 190 that reflects transmitted radiation beams 115 back to radiation-sensing region 130 to be recaptured. In some embodiments, the Bragg mirror includes a stack with an odd number (2m+1) of alternating layers of high-index and low-index material. Where "m" is the desired number of either the high-index layers or low-index layers and 2m is the number of high-index and low-index pairs. For example, if the desired number of high-index material layers is 3, the Bragg mirror stack will have 7 total layers. More specifically, the Bragg mirror stack wilt have 6 pairs of high-index and low-index layers plus one additional high-index layer so that the top and the bottom layers of the Bragg mirror stack are high-index material layers. In some embodiments, the first (e.g., bottom) and the last (e.g., top) layer of the Bragg mirror stack is a high-index material layer.

Figure 2:
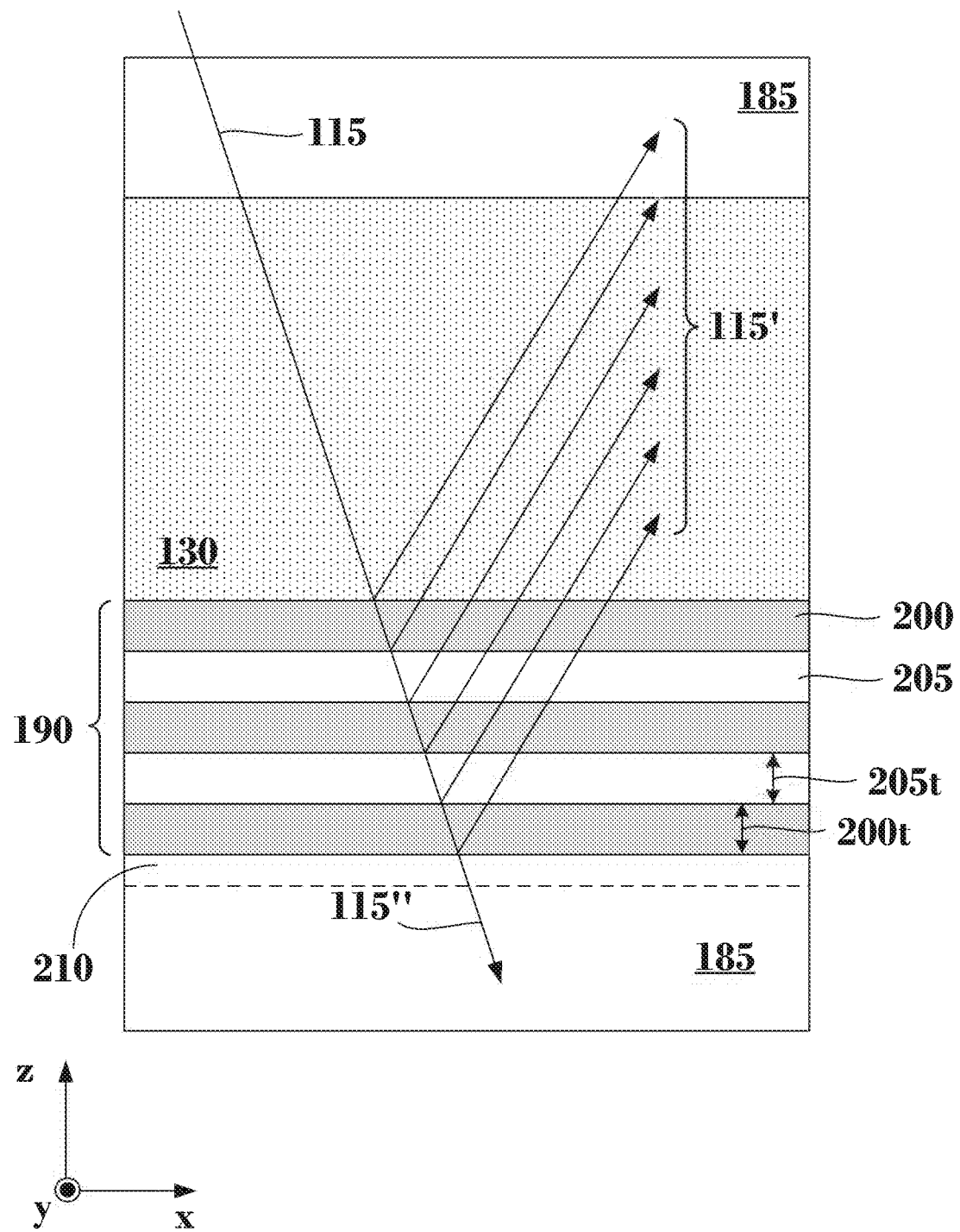
FIG. 2 is a magnified cross-sectional view of a radiation-sensing region with a Bragg mirror, in accordance with some embodiments.

According to some embodiments, FIG. 2 is a magnified view of radiation-sensing region 130 and Bragg mirror 190 shown in FIG. 1. As shown in FIG. 2, Bragg mirror 190 includes alternating layers of high-index material 200 and low-index material 205. As a result of the configuration of Bragg mirror 190, incident radiation beam 115 is partially reflected from the interface of each high-index material 200 and low-index material 205 as it travels through the stack to form reflected radiation beams 115'. Reflected radiation beams 115' enter radiation-sensing region 130 for photon recapture. A fraction of reflected radiation beams 115' will be converted to an electrical signal within radiation sensing region 130 due to the photon recapture process and any non-captured portion of radiation beams 115' will escape radiation-sensing region 130. A second portion of incoming radiation beam 115 can be absorbed by the stack (not shown) and a third portion of incident radiation beam 115 can be transmitted into substrate 185 as indicated by arrow 115".

In some embodiments, the number of high-index material 200 and low-index material 205 and their respective thicknesses is selected such that the intensity of the incoming radiation beam 115 decreases as it travels through the stack. At the same, the intensity of reflected radiation beams 115' increases provided that the absorbance by the stack is negligible. The aforementioned condition is possible if reflected radiation beams 115' are in phase (or have a phase difference that is a multiple of 360° (2π)) to encourage constructive interference. This can be achieved if the thicknesses 200 t and 205 t of high-index material 200 and low-index material 205 respectively are equal to $\lambda/(4n_H)$ and $\lambda/(4n_L)$; where $n_H$ is the refractive index of the high-index material 200, $n_L$ is the refractive index of low-index material 205, and $\lambda$ is the wavelength of incident radiation beam 115. For this reason, Bragg mirror stack may be referred to as a "quarter-wave" stack. Based on the above, high-index material 200 is formed thinner than low-index material 205 (e.g., 200 t<205 t)

In some embodiments, the reflectivity achieved in Bragg mirror 190 is determined by the number of layer pairs (2m) of high-index material 200 and low-index material 205 and their refractive index contrast e.g., the refractive index difference between high-index material 200 and low-index material 205. For example, between two Bragg mirrors having layers with a substantially similar refractive index contrast and different number of layer pairs, the Bragg mirror with the larger number of layers pairs can achieve the highest reflectance value. Further, between two Bragg mirrors having the same number of layer pairs and different refractive index contrast, the Brag mirror with the highest index contrast layers can achieve the highest reflectance value. Consequently, thinner Bragg mirrors (e.g., with fewer layers) can be fabricated if high-index material 200 and low-index material 205 are selected with a high refractive index contrast. In addition, the reflection bandwidth (e.g., the number of wavelengths that can be reflected around a mean wavelength value $\lambda$, of incident radiation beam 115) increases when the index contrast between high-index material 200 and low-index material 205 is larger.

By way of example and not limitation, Bragg mirror 190 can include (i) titanium oxide ($TiO_2$) as high-index material 200 and silicon oxide ($SiO_2$) or magnesium fluoride ($MgF_2$) as low-index material 205, (ii) gallium arsenide (GaAs) as high-index material 200 and aluminum-arsenide (AlAs) as low-index material 205, or (iii) gallium nitride (GaN) as high-index material 200 and aluminum nitride (MN) as low-index material 205. This list is not exhaustive and other suitable material combinations can be used based on the desired reflective properties of Bragg mirror 190 and the desired operating wavelength or range of wavelengths.

In some embodiments, the reflectance rate R of Bragg mirror 190 having an odd number (2m+1) of layers is provided by formula (1) shown below:

$$R = \left(\frac{n_0 - Y}{n_0 + Y}\right)^2, \quad (1)$$

where $n_0$ is the refractive index of radiation-sensing region 130 and Y is the optical admittance provided by formula (2) shown below:

$$Y = \left(\frac{n_H}{n_L}\right)^{2m} \frac{(n_H)^2}{n_S}, \quad (2)$$

where nu is the refractive index of high-index material 200, $n_L$ is the refractive index of low-index material 205, $n_S$ is the refractive index of the layer formed directly on the stack, and 2m is the number of layer pairs in Bragg mirror 190.

For example, if radiation-sensing region 130 includes Ge with $n_0$=4 and Bragg mirror 190 incudes 7 layers (e.g., m=3) with high-index material 200 being $TiO_2$ with $n_H$=2.45, low-index material 205 being $SiO_2$ with $n_L$=1.45, and $n_s$ being a silicon sub-oxide ($SiO_x$) 210 (e.g., a cover layer on Bragg mirror 190) with $n_S$=1.46, then reflectance R is about 84.6% and admittance Y is about 97.7.

Figure 3:
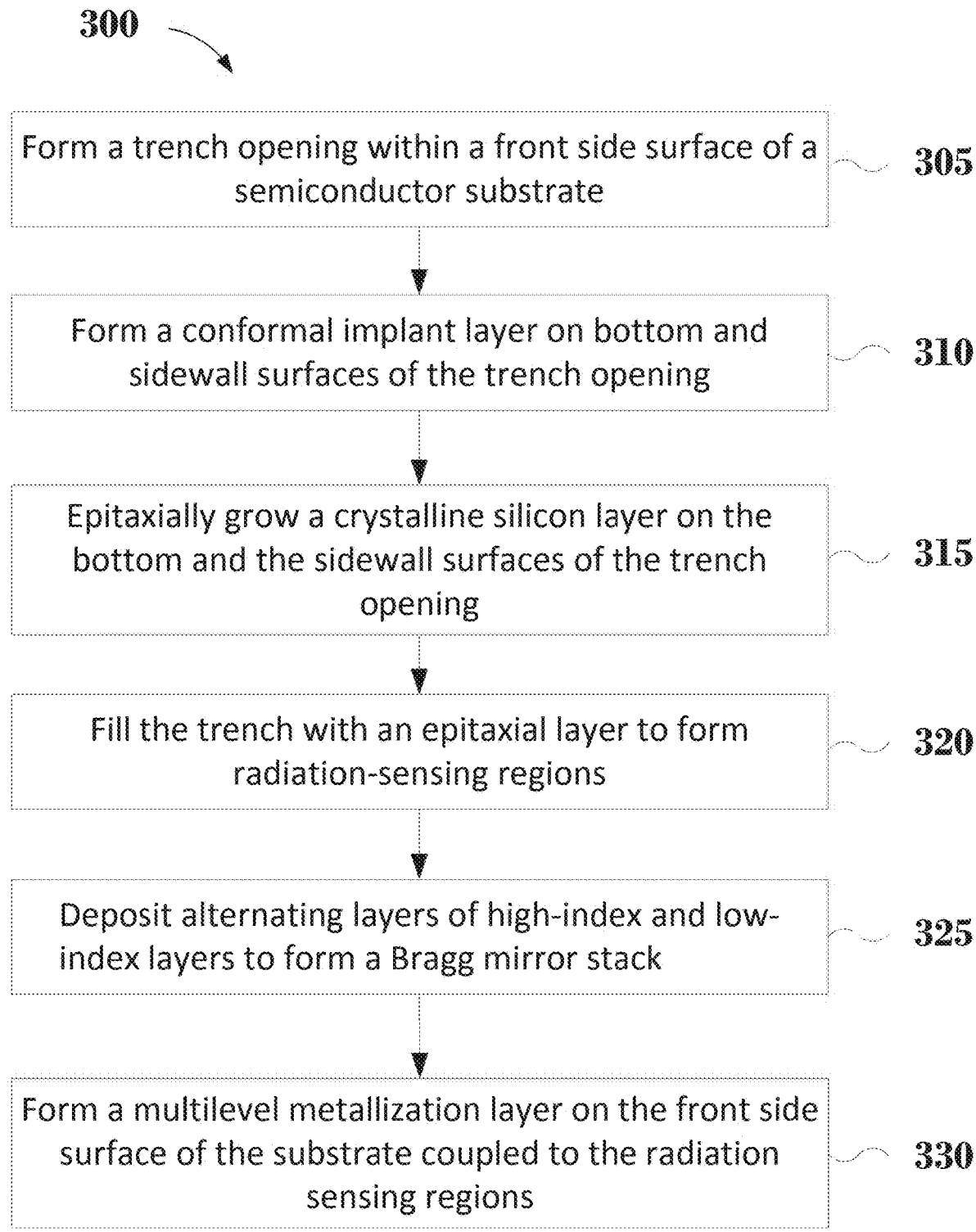
FIG. 3 is a flow chart of a fabrication method describing the formation process of Bragg mirrors on radiation-sensing regions in a back side illuminated (BSI) image sensor device, in accordance with some embodiments.

FIG. 3 is a flow chart of a fabrication method 300 describing the formation process of Bragg mirrors 190 shown in FIGS. 1 and 2. Other fabrication operations may be performed between the various operations of method 300 and may be omitted merely for clarity and ease of description. These various operations are within the spirit and the scope of this disclosure. Moreover, not all operations may be required to perform the disclosure provided herein. Additionally, some of the operations may be performed simultaneously, or in a different order than the ones shown in FIG. 3. In some embodiments, one or more other operations may be performed in addition to or in place of the presently described operations.

For illustrative purposes and ease of description, method 300 will be described with reference to the formation of a single Bragg mirror stack; however, it should be understood that an array of Bragg mirror stacks can be formed concurrently using method 300. In addition, method 300 will be described using FIGS. 4-11. The figures provided to describe method 300 are for illustrative purposes only and are not to scale. In addition, the figures may not reflect the actual geometry of the real structures, features, or films. Some structures, films, or geometries may have been deliberately augmented or omitted for illustrative purposes.

Figure 4:
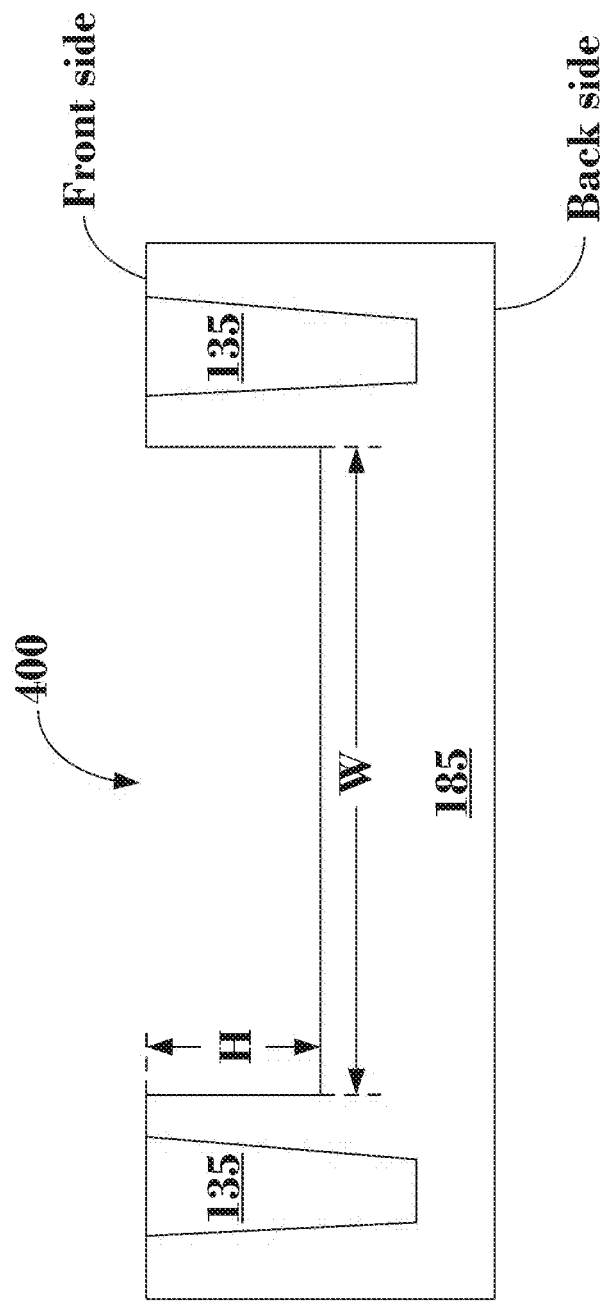
FIG. 4-11 are cross-sectional views of intermediate structures during the fabrication of Bragg mirrors on radiation-sensing regions in a back side illuminated (BSI) image sensor device, in accordance with some embodiments.

In referring to FIG. 3, method 300 begins with operation 305 and the process of forming a trench opening within a front side surface of a semiconductor substrate. By way of example and not limitation, FIG. 4 is a partial cross-sectional view of substrate 185 after the formation of a trench opening 400 according to operation 305 of method 300. In some embodiments, isolation structures 135 (formed prior to the formation of trench opening 400) are used as alignment marks for positioning trench opening 400. As discussed above, an array of trench openings, like trench opening 400, can be formed during operation 305 within the front side surface of substrate 185. In subsequent operations of method 300, the radiation-sensing regions and Bragg mirrors will be formed in respective trench openings, like trench opening 400. In some embodiments, formation of trench opening 400 requires the use of photolithography and etching operations. For example, a hard mask or photoresist (not shown) can be deposited and patterned on the front side surface of substrate 185. The patterned hard mask or photoresist is subsequently used as an etch mask to form trench openings 400 within the front side surface of substrate 185.

In some embodiments, substrate 185 is a photonic wafer e.g., a wafer made of a material appropriate for photonic applications. By way of example and not limitation, substrate 185 can include Si or another elementary semiconductor such as, for example, (i) Ge; (ii) a compound semiconductor including SiGe, silicon carbide (SiC), GaAs, gallium phosphide (GaP), indium phosphide (InP), indium arsenide (InAs), and/or indium antimonide (InSb); (iii) an alloy semiconductor including gallium arsenide phosphide (GaAsP), aluminum indium arsenide (AlInAs), aluminum gallium arsenide (AlGaAs), gallium indium arsenide (GaInAs), indium phosphide (GaInP), and/or gallium indium arsenide phosphide (GaInAsP); or (iv) combinations thereof.

For example purposes, substrate 185 will be described in the context of Si (e.g., single crystalline). Based on the disclosure herein, other materials, as discussed above, can be used. These materials are within the spirit, and scope of this disclosure.

As discussed above, isolation structures 135 are configured to minimize cross talk and signal loss between the radiation-sensing regions and can be formed, for example, by etching substrate 185 to form trench openings that can be subsequently filled with a dielectric material such as silicon oxide. In some embodiments, isolation structures 135 are taller than height H of trench opening 400 along the z-direction and narrower than width W of trench opening 400 along the x-direction. By way of example and not limitation, height H of trench opening 400 can range between about 50 nm and about 700 μm and width W can range between about 50 nm and about 700 μm. Larger or smaller trench openings 400 are possible. By way of example and not limitation, the depth of trench openings 400 along the y-direction can about 5 μm.

It is noted that substrate 1185 shown in FIG. 4 is rotated 180° with respect to the orientation of substrate 185 shown in FIG. 1. In other words, substrate 185 in FIG. 1 is turned "upside down." In some embodiments, the formation of the radiation-sensing regions as described herein is performed from the front side surface of substrate 185.

Figure 5:
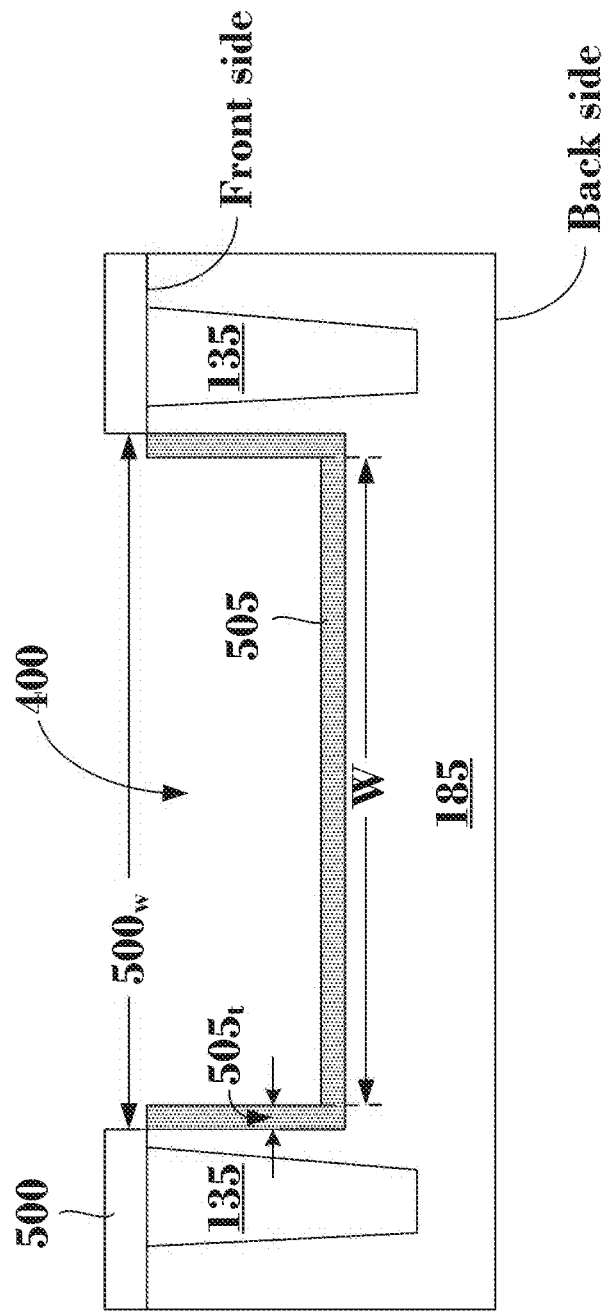

In referring to FIG. 3, method 300 continues with operation 310 and the process of forming a conformal implant layer on bottom and sidewall surfaces of trench opening 400. In some embodiments, this can be achieved by depositing and patterning undoped silicon glass (USG) at a thickness of about 75 nm. USG has a high deposition rate at low temperatures and similar properties to silicon oxide. By way of example and not limitation, USG can be deposited via plasma enhanced chemical vapor deposition (PECVD), high density plasma CVD (HDP-CVD), or sub-atmospheric CVD (SACVD). The USG is then patterned and used as an implant mask in a subsequent implant process. FIG. 5 shows the resulting structure after operation 310 with patterned USG layer 500 disposed on the front side surface of substrate 185 and implant layer 505 formed on sidewall and bottom surfaces of trench opening 400. In some embodiments, a rapid thermal anneal (RTA) process is used to activate the dopants within implant layer 505. During the RTA process, thickness $505_t$ of implant layer 505 can increase due to dopant mobility.

Because patterned USG layer 500 is used as an implant mask, the sidewalls of patterned USG layer 500 are not aligned to the sidewalk of trench opening 400. More specifically, width $500_w$ (the width of the openings formed in the USG layer by the patterning process) is larger than width W of trench opening 400 by an amount equal to about the thickness of implant layer 505. In other words, $500_w - W \approx 505_t$. In some embodiments, the thickness of implant layer 505 is about 100 nm and the dopant used to form implant layer 505 is boron. In some embodiments, implant layer 505 isolates the radiation-sensing region from substrate 185 and prevents signal loss through leakage to substrate 185. Thus, thickness $505_t$ and the dopant concentration can be tailored to achieve sufficient electrical isolation.

Figure 6:
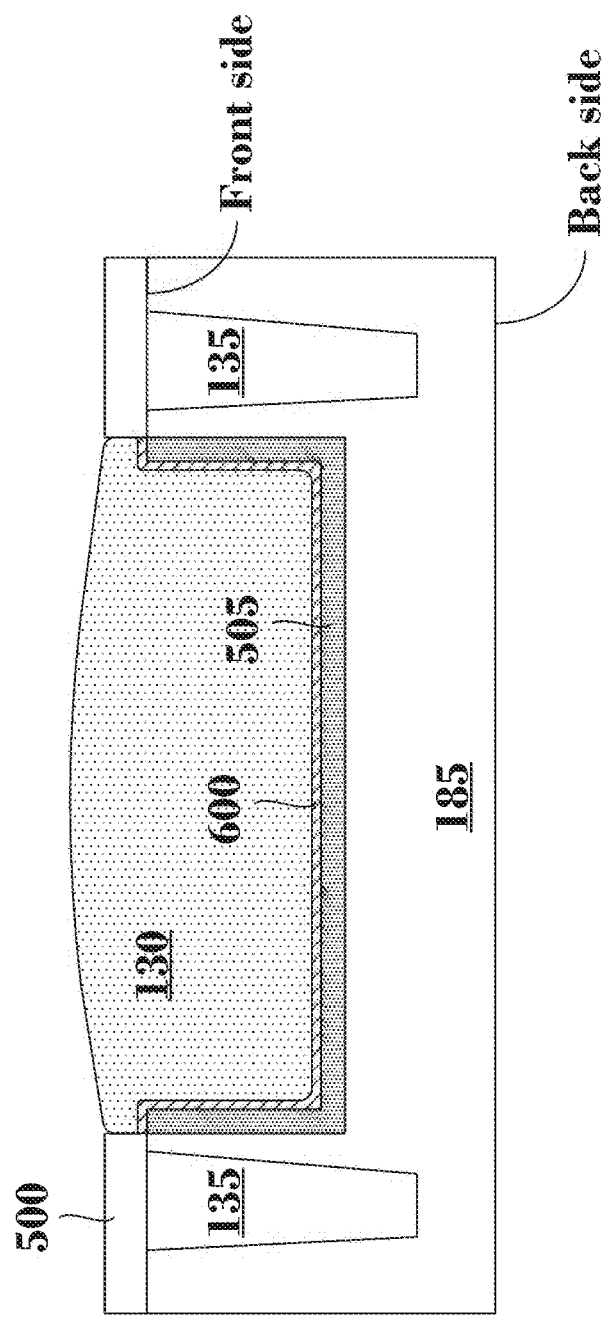

In referring to FIG. 3, method 300 continues with operation 315 and the process of epitaxially growing a crystalline Si (c-Si) layer on the bottom and sidewalk surfaces of trench opening 400. In some embodiments, the c-Si epitaxial layer is a "buffer layer" that facilitates the formation of the radiation-sensing region and prevents the formation of defects. By way of example and not limitation, the c-Si epitaxial layer can be grown with a CVD epitaxial process using silane ($SiH_4$). FIG. 6 shows c-Si epitaxial layer 600 grown on implant layer 505 according to operation 315 of method 300. In some embodiments, c-Si epitaxial layer 600 selectively grows on exposed surfaces of substrate 185, which is also crystalline as discussed above. In other words, c-Si epitaxial layer 600 does not grow on patterned USG layer 500. In some embodiments, the thickness of c-Si epitaxial layer is about 45 nm. Thinner c-Si epitaxial layers (e.g., thinner than about 45 nm) may not prevent the appearance of defects in the radiation-sensing regions grown thereon and thicker c-Si epitaxial layers (e.g., thicker than about 45 nm) occupy additional space within trench opening 400 without offering additional benefits to the radiation-sensing regions.

In referring to FIG. 3, method 300 continues with operation 320 and the process of filling trench opening 400 with an epitaxial layer to form radiation-sensing regions 130. By way of example and not limitation, radiation-sensing regions 130 include epitaxially grown Ge. As discussed above, the material for radiation-sensing regions 130 can be selected based on the wavelength range which the BSI image sensor device is configured to detect. By way of example and not limitation, additional materials that can be used for radiation-sensing regions 130 include semiconductor materials in the group, such as GaAs, InP, GaP, and GaN. In some embodiments, if a different material than Ge is used for radiation-sensing regions 130, c-Si epitaxial layer 600 can be replaced with another more appropriate epitaxial layer. Thus, different combinations of epitaxial layers in operations 315 and 320 can be used to achieve substantially defect-free radiation-sensing regions 130. In some embodiments, defects in radiation-sensing regions 130 can impact the photon conversion performance of radiation-sensing regions 130.

Figure 7:
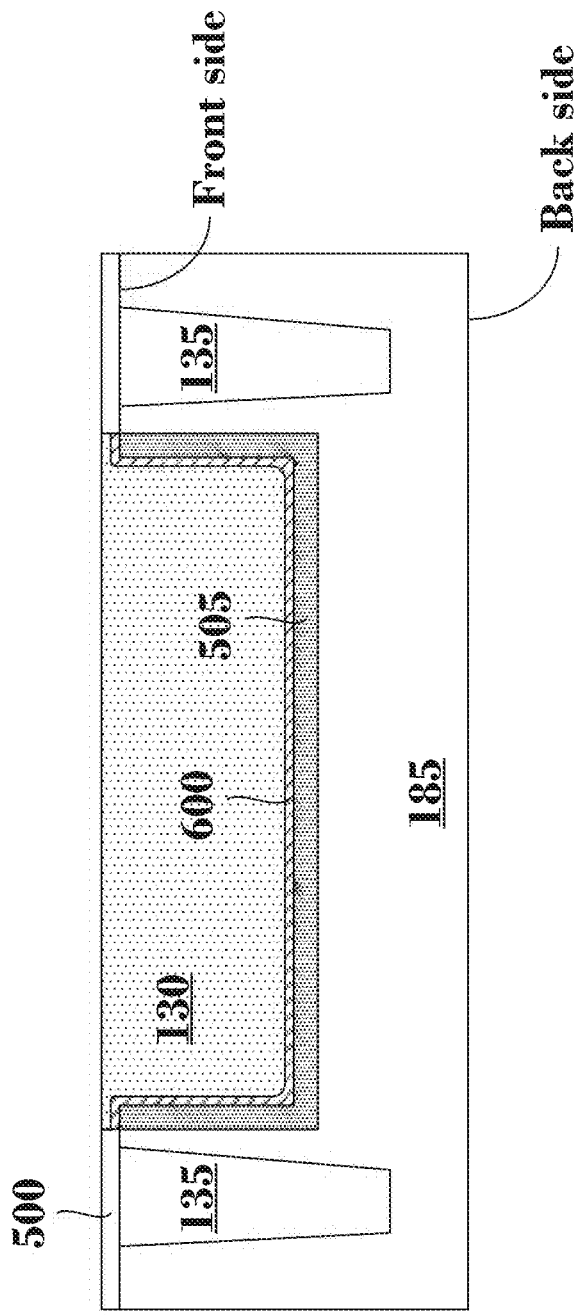

In some embodiments, radiation-sensing regions 130 can be grown with a CVD process using an appropriate precursor gas (e.g., germane ($GeH_4$)). After the material growth of radiation-sensing regions 130, a chemical mechanical polishing (CMP) process is used to planarize the surface of the radiation-sensing region 130 so that top surfaces of radiation-sensing region 130 and patterned USG layer 500 are substantially co-planar as shown in FIG. 7. During the aforementioned CMP process, patterned. USG layer 500 is polished down (e.g., thinned) but not removed from the front side surface of substrate 185.

In referring to FIG. 3, method 300 continues with operation 325 and the process of depositing alternating layers of high-index and low-index layers to form a Bragg mirror stack, like Bragg mirror 190 shown in FIGS. 1 and 2. As discussed above, high-index and low-index layers can be selected from materials such as $TiO_2$, $SiO_2$, GaAs, AlAs, AlN, etc. In some embodiments, the thickness of these layers is adjusted to about $\lambda/(4n)$; where n is the respective refractive index of each layer and $\lambda$ is the desired wavelength to be detected (e.g., the wavelength of incident radiation beam 115). As discussed above, the reflectivity achieved by the Bragg mirror is determined by the number of layer pairs (2m) of the high-index and the low-index materials and their refractive index contrast. Consequently, thinner Bragg mirrors can be fabricated if the high-index material and the low-index material are selected with a high refractive index contrast the largest refractive index difference possible). In addition, the reflection bandwidth (e.g., the number of wavelengths that can be reflected around a mean wavelength value of the incident radiation beam) increases when the index contrast between the high-index material and low-index material is greater. Therefore, the higher the refractive index contrast, the wider the reflection bandwidth and the number of wavelengths around a mean wavelength value that can be reflected by the Bragg mirror structure.

Consequently, radiation-sensing regions made from different materials, and configured to respond to different wavelengths, require Bragg mirrors with different types of layers, different number of layers, different layer thicknesses, or combination thereof. In some embodiments, the BSI image sensor device can be divided into areas where the radiation-sensing material is different for each area so that the BSI image sensor is capable of detecting a larger spectrum of wavelengths. Therefore, respective Bragg mirrors with appropriate layer characteristics (e.g., number of layers, types of layers, thickness of layers, or combinations thereof) can be formed for each radiation-sensing region using a combination of photolithography, etching, and deposition operations.

In some embodiments, high-index and the low-index materials can be deposited with CVD-based methods, atomic layer deposition (ALD)-based methods, or any suitable method capable of achieving appropriate layer thickness control and thickness uniformity. Thickness control (e.g., in the sub-nm thickness uniformity (e.g., in the sub-nm level), along with surface roughness control (e.g., in the Å level) ensure that the reflected radiation beams are not out of phase.

Figure 8:
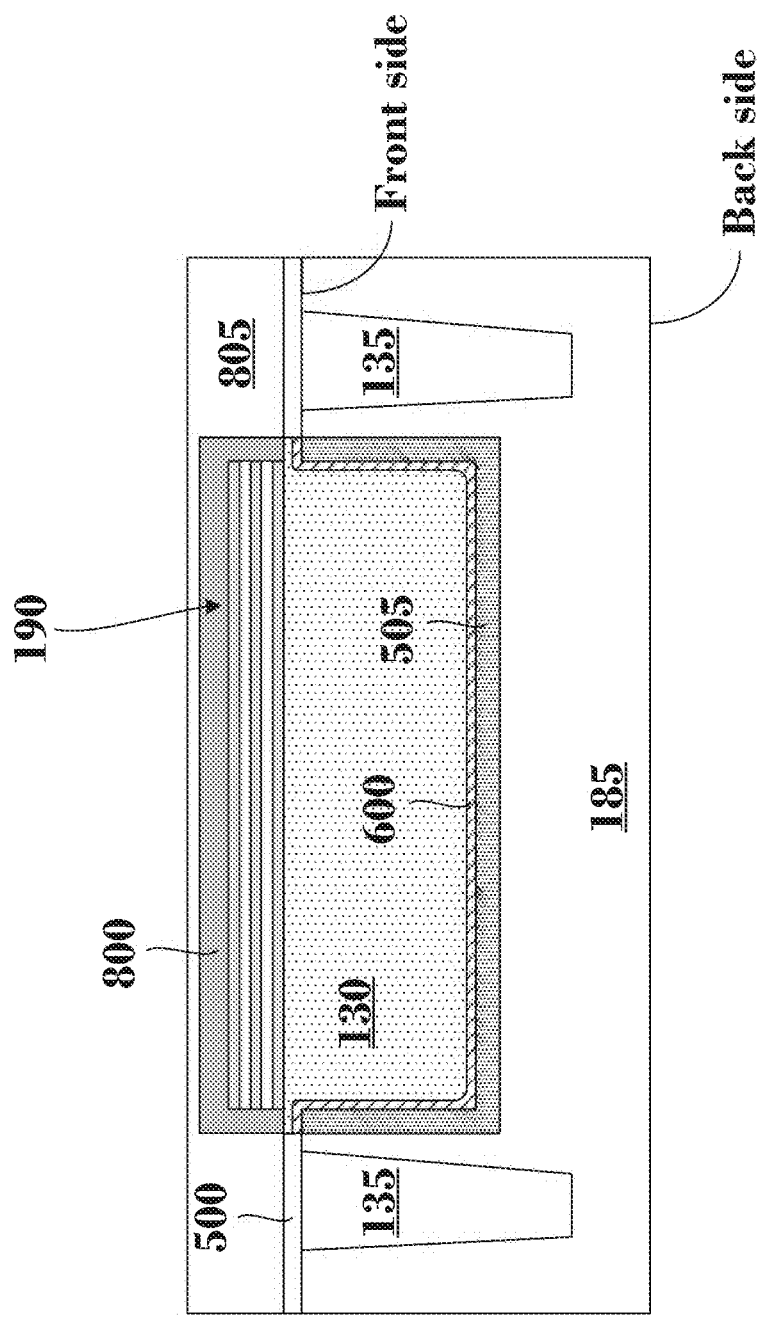

In some embodiments, after the deposition of the stack, the layers of the high-index material and the low-index material are patterned to form individual Bragg mirrors 190 on respective radiation-sensing regions 130 as shown in FIGS. 1 and 8. Further, as discussed above, the top and bottom layers of Bragg mirrors 190 are high-index material.

Subsequently, a protective capping layer 800 (e.g., a silicon epitaxial layer) is selectively deposited on Bragg mirror 190 at a thickness of about 40 nm, followed by a dielectric layer 805 deposition and a CMP process that planarizes dielectric layer 805, as shown in FIG. 8, so that the remaining thickness of dielectric layer 805 on protective capping layer 800 is about 15 nm. By way of example and not limitation, dielectric layer 805 can be USG, silicon oxide, or any other suitable dielectric material that is transparent to the wavelength of the incident radiation. In some embodiments, protective capping layer 800 surrounds Bragg mirror 190 and does not grow on patterned USG layer 500.

Figure 9:
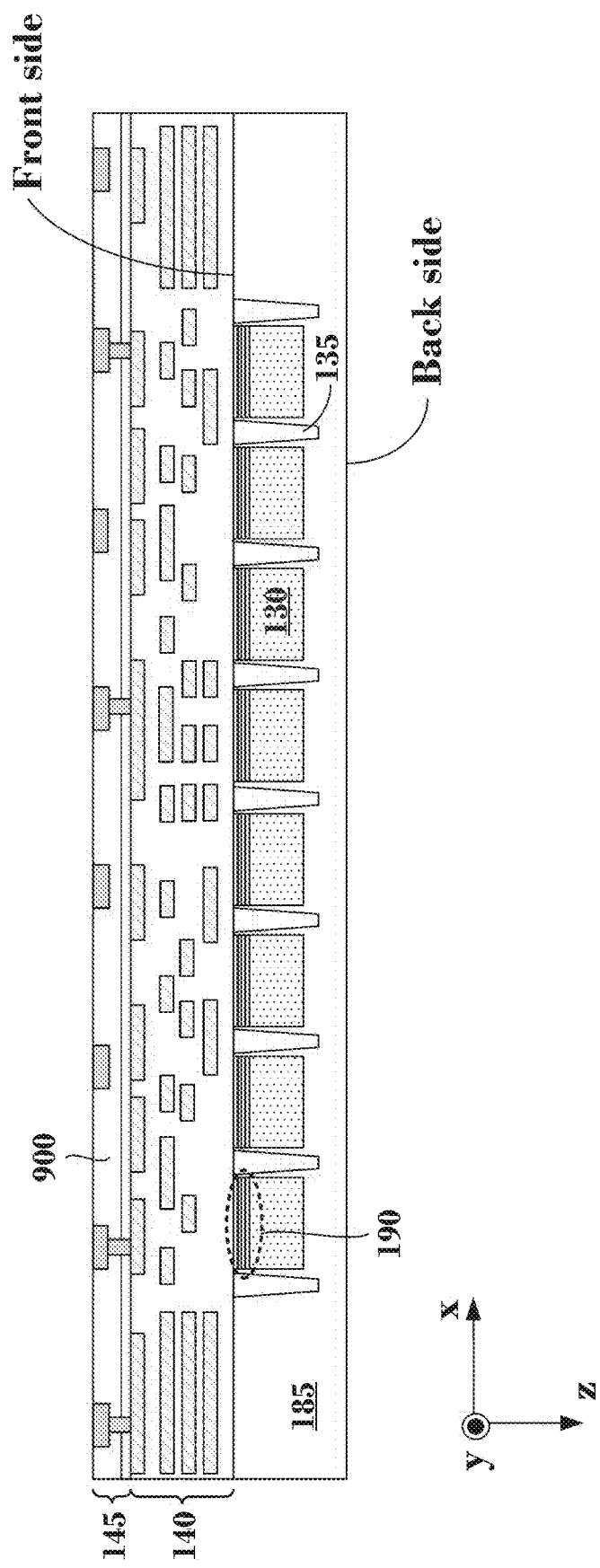

In referring to FIG. 3, method 300 continues with operation 330 and the process of forming multilevel metallization layer 140 on the front side surface of substrate 185 coupled to radiation-sensing regions 130 as shown in FIG. 9. In some embodiments, multilevel metallization layer 140 can include any number of metallization layers (e.g., between about 1 and about 9) for effective signal propagation from radiation sensing regions 130 to the ASCI. In some embodiments, each layer of multilevel metallization layer 140 includes a network of metal wiring in the form of vias and lines. Vias (not shown in FIG. 9) are electrically coupled to radiation sensing regions 130 to propagate the electrical signal generated during the photon conversion process when incident radiation enters the BSI image sensor device from the back side surface of substrate 185.

Bonding structures 145 are formed in a dielectric layer 900, which is formed on the top layer of multilevel metallization layer 140. Bonding structures 145 are aligned to respective bonding structures of the ASCI when the two devices are physically and electrically bonded together to form stack 100 shown in FIG. 1. In some embodiments, bonding structures 145 are electrically coupled to the top layer of multilevel metallization layer 140 as shown in FIG. 9.

Figure 10:
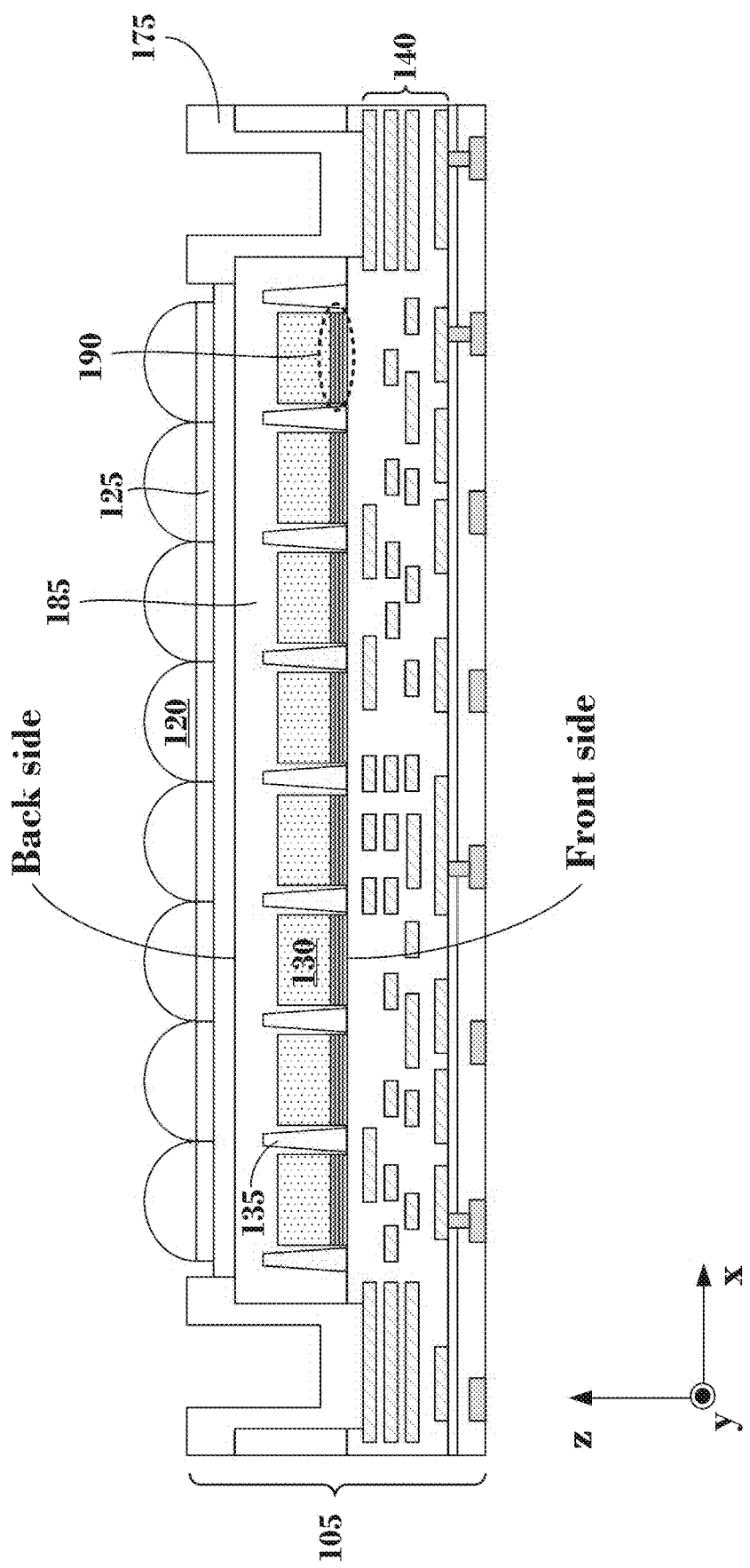
Figure 11:
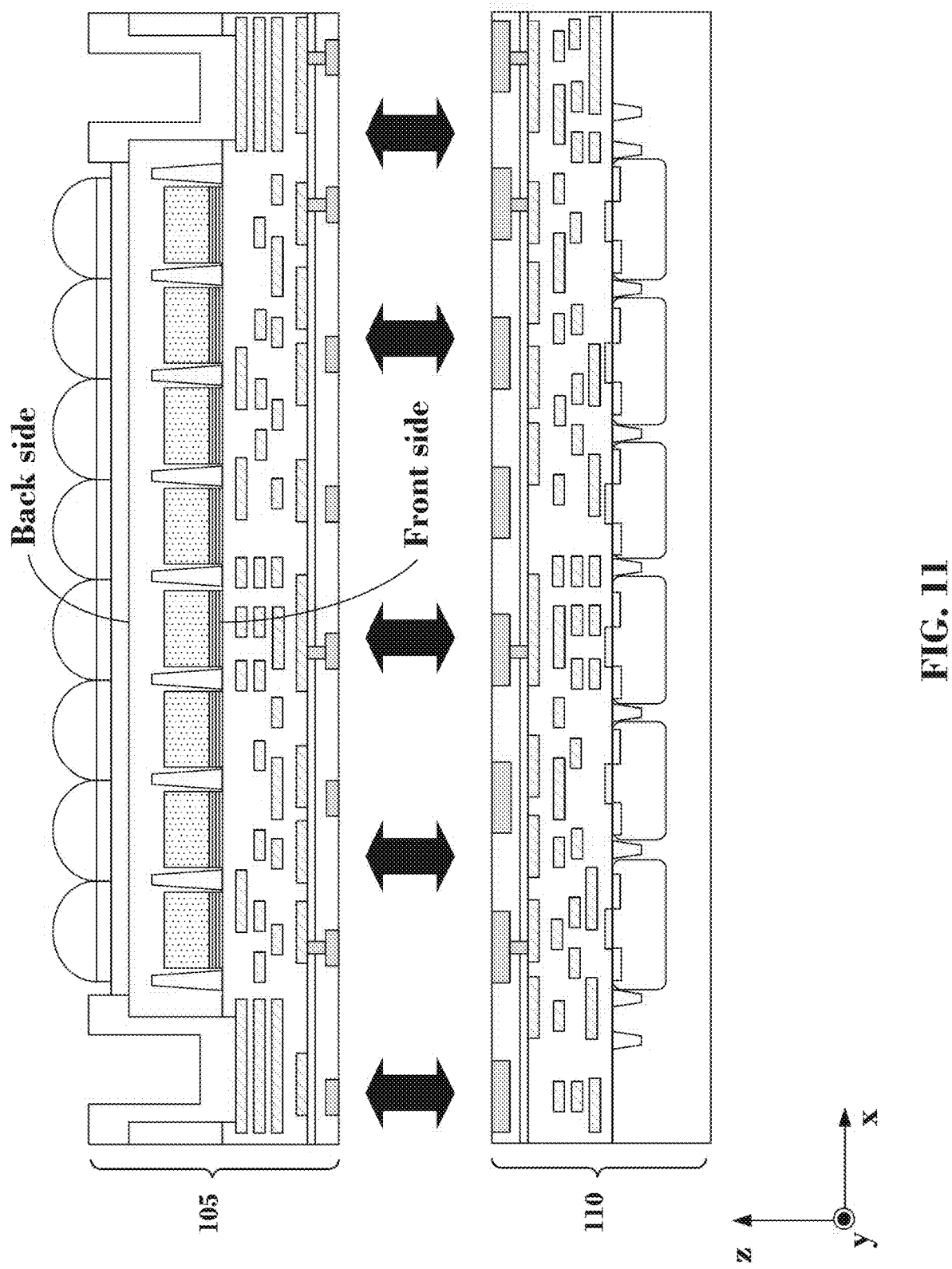

In some embodiments, for the formation of additional components of BSI image sensor device 105 shown in FIG. 1 (e.g., the formation of color filters 125, micro-lenses 120, and pad structures 175), the partial fabricated BSI image sensor device of FIG. 9 is rotated 180° so that the back side surface of substrate 185 faces up, as shown in FIG. 10. Once these components are formed, the bonding structures of BSI image sensor device 105 and ASCI 110 are aligned and bonded together as shown in FIG. 11. By way of example and not limitation, solder bumps 180 shown in FIG. 1 can be formed after the bonding process.

Figure 12A:
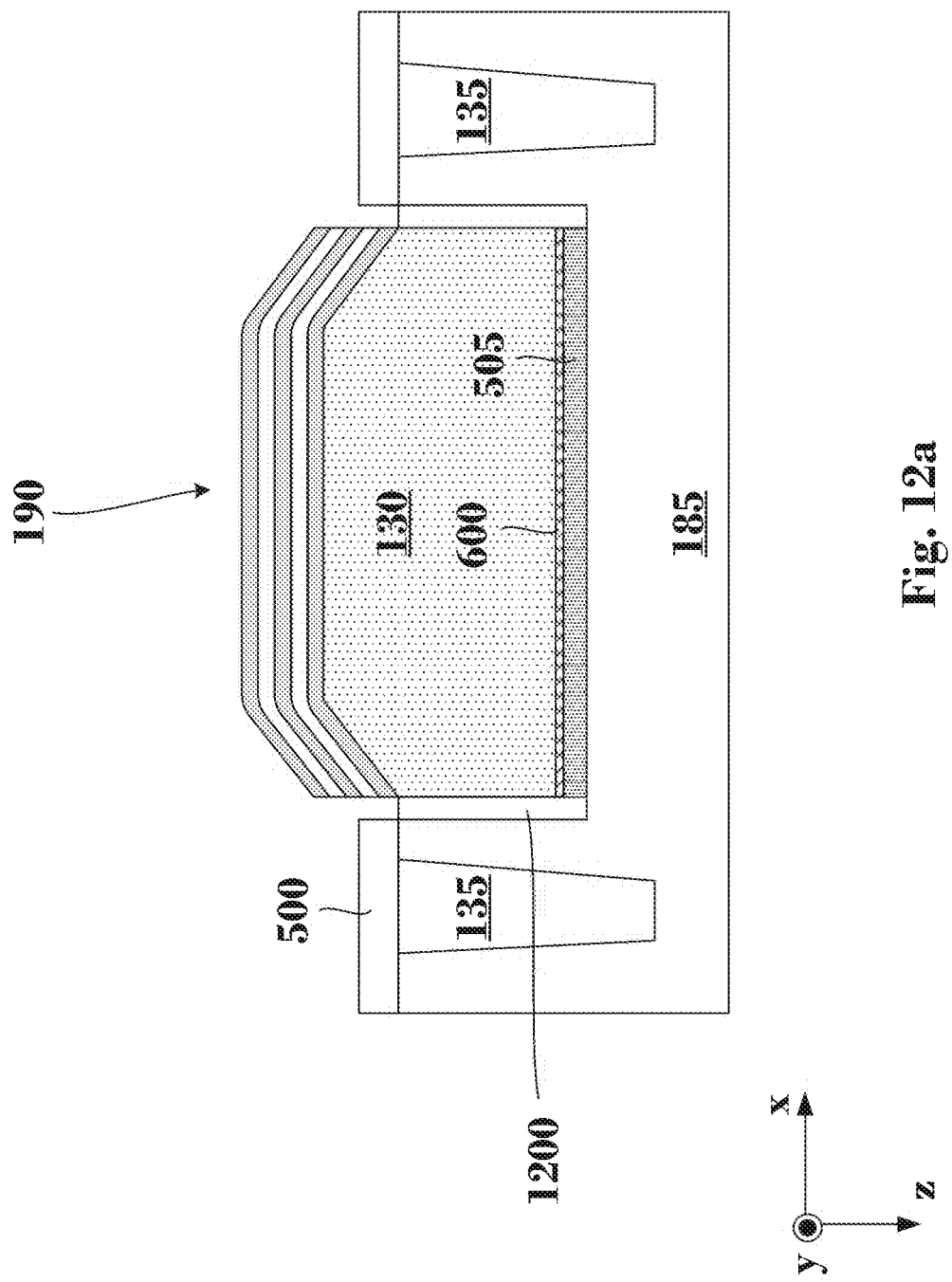
FIG. 12a is a cross-sectional view of a Bragg mirror formed on multiple surfaces of a radiation sensing region in a back side illuminated (BSI) image sensor device, in accordance with some embodiments.

In some embodiments, the formation of Bragg mirror 190 may not be limited to a single surface of radiation sensing region 130 (e.g., the top surface as shown in FIG. 8). For example, as shown in FIG. 12*a*, radiation-sensing region 130 can be grown with facets, which are subsequently covered with the layers of Bragg mirror 190. The benefit of such structure is that additional surface area of radiation-sensing region 130 can be utilized by Bragg mirror 190 to reflect the transmitted incident radiation beam back to radiation-sensing region 130. In some embodiments, growth of facets is encouraged by the formation of spacers 1200 formed on the sidewalls of the trench opening prior to the formation of radiation-sensing region 130.

In referring to FIGS. 12*b-e*, spacers 1200 can be formed, for example, as follows. After the formation of trench opening 400 and patterned USG layer 500, a thermal oxidation process grows a silicon oxide layer 1200' on exposed surfaces of trench opening 400 as shown in FIG. 12*b*. Since the front side surface of substrate 185 is covered by patterned USG layer 500, there is no formation of silicon oxide on surfaces outside trench opening 400. Subsequently, an anisotropic etching process removes portions of silicon oxide layer 1200' from the bottom of trench opening 400 to form spacers 1200 as shown in FIG. 12*c*. After the aforementioned etching operation, the remaining thickness of spacers 1200 is less than about 10 nm. In some embodiments, thicker spacers are possible; however thicker spacers deprive valuable space from radiation-sensing region 130. Subsequently, implant layer 505 and c-Si epitaxial layer can be formed as described in method 300 (shown in FIG. 12*d*), followed by the growth of radiation-sensing region 130 shown in FIG. 12*e*. In some embodiments, the presence of the spacers 1200 facilitates the formation of facets in radiation-sensing region 130 as shown in FIG. 12*e* and the isometric view of radiation-sensing region 130 shown in the inset of FIG. 12*e*.

The aforementioned formation process of faceted radiation-sensing regions 130 is not limiting and similar operations performed in a different order or alternative fabrications operations are possible and within the spirit and the scope of this disclosure. For example, spacers 1200 can be formed prior to the formation of patterned USG layer 500 or after the formation of implant layer 505 and c-Si epitaxial layer 600.

Figure 13:
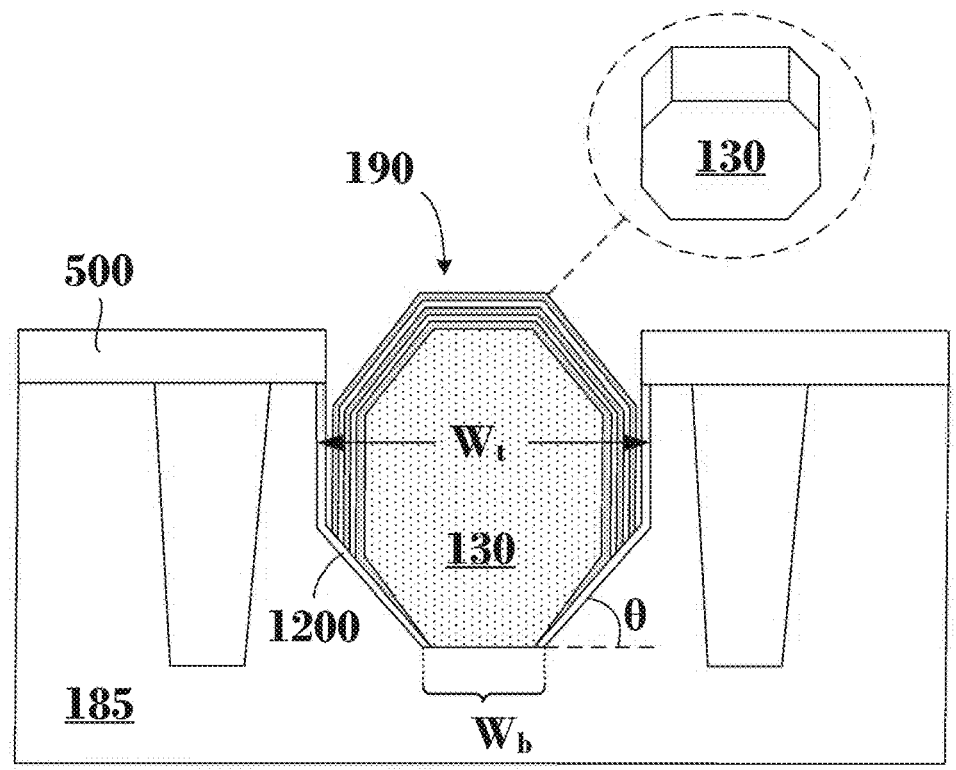
FIG. 13 is a cross-sectional view of a Bragg mirror formed on an octahedron-shaped radiation sensing region in a back side illuminated (BSI) image sensor device, in accordance with some embodiments.
Figure 14:
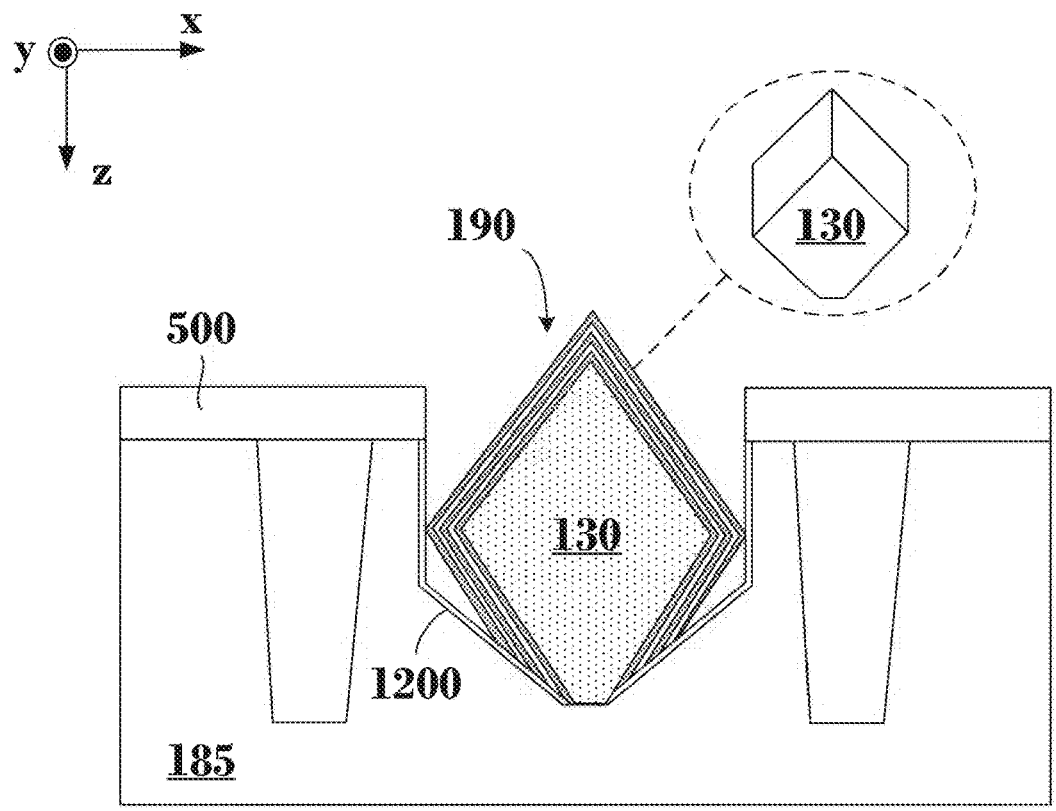
FIG. 14 is a cross-sectional view of a Bragg mirror formed on a diamond-shaped radiation sensing region in a back side illuminated (BSI) image sensor device, in accordance with some embodiments.

In some embodiments, the combination of spacers 1200 and the shape of trench opening 400 can produce a variety of radiation-sensing region shapes with different number of facets—e.g. ranging from an octahedron to a diamond as shown respectively in FIGS. 13 and 14. Consequently, Bragg mirror 190 formed thereon will follow the edge contour of the underlying radiation-sensing region 130. In some embodiments, controlling sidewall angle θ and bottom width $W_b$ of trench opening 400 produces the shapes of radiation-sensing region 130 shown in FIGS. 13 and 14. In some embodiments, sidewall angle θ ranges from about 30° to about 60° and bottom width $W_b$ is shorter than top width $W_t$. By way of example and not limitation, large sidewall angles (e.g., closer to 60°) and wide bottom widths $W_b$ (closer to top width $W_t$) produce radiation-sensing regions with more facets, like the octahedron-shaped radiation-sensing region 130 shown in FIG. 13 whose isometric view is shown in the inset of FIG. 13. On the other hand, small sidewall angles (e.g., closer to 30°) and narrow bottom widths $W_b$ equal to about or less than half top width $W_t$) produce radiation-sensing regions with fewer facets, like the diamond-shaped radiation-sensing region 130 shown in FIG. 14 whose isometric view is shown in the inset of FIG. 14. It is noted that bottom width $W_b$ cannot be less than about 100 nm because the amount of radiation entering radiation-sensing region 130 is reduced, which is undesirable.

It is noted, that any combination of the radiation-sensing devices and respective Bragg mirrors described herein can be used within a single BSI image sensor device.

Various embodiments in accordance with this disclosure describe the formation of mirror micro-structures on radiation-sensing regions at the exit path of the incident radiation. In some embodiments, the mirror micro-structures are Bragg mirrors that increase the optical path of the incident radiation within the radiation-sensing regions and thus improves photon recapture. According to some embodiments, each Bragg mirror includes a stack with alternating layer pairs of high-refractive index (high-index) and low-refractive index (low-index) material plus one additional layer of high-index material (2m+1); where 2m is the number of high-index and low-index layer pairs. In some embodiments, the thickness of these layers is adjusted to about 2λ/(4n); where n is the respective refractive index of each layer and 2 is the desired wavelength to be detected (e.g., the wavelength of incident radiation), The reflectivity achieved by the Bragg mirror is determined by the number of layer pairs (2m) of the high-index and the low-index materials and their refractive index contrast, Consequently, thinner Bragg mirrors can be fabricated if the high-index material and the low-index material are selected with a high refractive index contrast. In addition, the reflection bandwidth (e.g., the number of wavelengths that can be reflected around a mean wavelength value of the incident radiation beam) increases when the index contrast between the high-index material and low-index material is larger. By way of example and not limitation, the stack can include anywhere from 3 to 21 layers of high-index and low-index materials formed during or after the fabrication of the radiation-sensing regions. In some embodiments, the pair of high-index and low index layers includes respectively $TiO_2$ and $SiO_2$, GaAs and AlAs, or GaN and AlN. In some embodiments, a reflectance of 84.6% or higher can be achieved. In some embodiments, the Bragg mirror covers more than one surface (e.g., facet) of the radiation-sensing region. In some embodiments, the radiation sensing region includes Si, Ge, SiGe, or a III-V. In some embodiments, Ge radiation-sensing regions with facets can be formed with the implementation of silicon oxide spacers.

In some embodiments a method includes forming an opening within a front side surface of a substrate; forming a conformal implant layer on bottom and sidewall surfaces of the opening; growing a first epitaxial layer on the bottom and the sidewall surfaces of the opening; depositing a second epitaxial layer on the first epitaxial layer to fill the opening, where the second epitaxial layer forms a radiation-sensing region. The method further includes depositing a stack on exposed surfaces of the second epitaxial layer, where the stack includes alternating pairs of a high-refractive index material layer and a low-refractive index material layer.

In some embodiments, an image sensor includes a substrate with a front side surface and an opposite back side surface; micro-lenses formed on the back side surface of the substrate; color filters disposed between the micro-lenses and the back side surface of the substrate; radiation-sensing regions in trenches formed in the front side surface of the substrate, where the radiation-sensing regions comprise an epitaxial semiconductor material. The image sensor further includes a mirror structure disposed on surfaces of the epitaxial semiconductor material having alternating layers of a first material layer with a first refractive index value and a second material layer with a second refractive index value different from the first refractive index value; and a metallization layer formed on the front side surface of the substrate over the radiation-sensing regions and the mirror structure.

In some embodiments, an image sensor includes a substrate with a front side surface and an opposite back side surface; trenches formed in the front side surface of the substrate, where a bottom portion of the trenches has a tapered profile. The image sensor further includes radiation-sensing regions in the trenches where the radiation sensing regions include an epitaxial semiconductor material layer with facets. Additionally, the image sensor includes an oxide layer disposed between surfaces of the trenches and the facets of the epitaxial semiconductor material layer; and a stack of alternating layers disposed on the facets of the epitaxial semiconductor material layer, where the alternating layers comprise a first material layer with a first refractive index and a second material layer with a second refractive index.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. An image-sensing structure, comprising:
    a stack structure, comprising:
        a first layer with a first refractive index and a first thickness substantially equal to one fourth of a wavelength of an incident radiation divided by the first refractive index; and
        a second layer with a second refractive index different from the first refractive index and a second thickness substantially equal to one fourth of the wavelength of the incident radiation divided by the second refractive index;
    a radiation-sensing region comprising a first epitaxial layer disposed on the stack structure;
    a second epitaxial layer in contact with a sidewall and a top surface of the radiation-sensing region; and
    an implant layer in contact with a sidewall and a top surface of the second epitaxial layer.

2. The image-sensing structure of claim 1, wherein the first refractive index is greater than the second refractive index, and wherein the first thickness is less than the second thickness.

3. The image-sensing structure of claim 1, wherein the stack structure further comprises additional first layers and additional second layers, and wherein a difference between a total number of the first layers and a total number of the second layers is one.

4. The image-sensing structure of claim 1, wherein the first layer comprises titanium oxide ($TiO_2$), gallium arsenide (GaAs), or gallium nitride (GaN), and wherein the second layer comprises silicon oxide ($SiO_2$), aluminum arsenide (AlAs), or aluminum nitride (AlN).

5. The image-sensing structure of claim 1, wherein the first epitaxial layer comprises germanium (Ge) or a III-V compound semiconductor material, and wherein the second epitaxial layer comprises silicon (Si).

6. The image-sensing structure of claim 1, further comprising:
    a protective capping layer in contact with a sidewall and a bottom surface of the stack structure; and
    a dielectric layer in contact with a sidewall and a bottom surface of the protective capping layer.

7. The image-sensing structure of claim 1, further comprising:
    a metallization layer disposed below the stack structure; and
    an application specific integrated circuit (ASIC) disposed below and electrically coupled to the metallization layer, wherein the metallization layer and the ASIC are configured to propagate an electric signal from the radiation-sensing region to a signal processing device.

8. The image-sensing structure of claim 1, further comprising:
    a deep trench isolation (DTI) structure interposed between the radiation-sensing region and an adjacent radiation-sensing region; and
    an undoped silicon glass (USG) layer disposed below the DTI structure.

9. The image-sensing structure of claim 8, wherein the USG layer is in contact with the radiation-sensing region and the second epitaxial layer, and wherein a bottom surface of the USG layer is substantially coplanar with a bottom surface of the radiation-sensing region.

10. The image-sensing structure of claim 1, further comprising:
    a color filter disposed on the radiation-sensing region; and
    a micro lens disposed on the color filter and configured to focus the incident radiation toward the radiation-sensing region.

11. An image-sensing structure, comprising:
    a multi-faceted stack structure comprising a first layer with a first refractive index and a second layer with a second refractive index different from the first refractive index;
    a multi-faceted radiation-sensing region comprising a first epitaxial layer disposed on the multi-faceted stack structure;
    a second epitaxial layer in contact with a top surface of the multi-faceted radiation-sensing region;
    an implant layer in contact with a top surface of the second epitaxial layer; and
    a spacer in contact with a sidewall of the multi-faceted radiation-sensing region, a sidewall of the second epitaxial layer, and a sidewall of the implant layer.

12. The image-sensing structure of claim 11, wherein an angle between a bottom portion of the spacer and a horizontal direction is between about 30° and about 60°.

13. The image-sensing structure of claim 12, wherein the multi-faceted radiation-sensing region comprises a diamond shape when the angle is about 30°, and wherein the multi-faceted radiation-sensing region comprises an octahedron shape when the angle is about 60°.

14. The image-sensing structure of claim 11, wherein the first refractive index is greater than the second refractive index, and wherein a thickness of the first layer is less than a thickness of the second layer.

15. The image-sensing structure of claim 11, further comprising:
- a protective capping layer in contact with multiple facets of the multi-faceted stack structure; and
- a dielectric layer in contact with a sidewall and a bottom surface of the protective capping layer.

16. The image-sensing structure of claim 11, further comprising:
- a deep trench isolation (DTI) structure interposed between the multi-faceted radiation-sensing region and an adjacent multi-faceted radiation-sensing region; and
- an undoped silicon glass (USG) layer disposed below the DTI structure and adjacent to the multi-faceted stack structure and the spacer.

17. A method for forming an image-sensing structure, comprising:
- forming a spacer on a sidewall of an opening in a substrate;
- implanting a dopant into a bottom of the opening to form an implant layer in contact with the spacer;
- epitaxially growing a crystalline layer on the implant layer and in contact with the spacer;
- epitaxially growing a multi-faceted radiation-sensing region on the crystalline layer and in contact with the spacer; and
- forming a multi-faceted stack structure, comprising:
  - depositing a first layer with a first refractive index on the multi-faceted radiation-sensing region; and
  - depositing a second layer with a second refractive index different from the first refractive index on the first layer.

18. The method of claim 17, wherein forming the spacer comprises:
- forming a bottom portion of the spacer at an angle between about 30° and about 60° with respect to a horizontal direction; and
- forming an upper portion of the spacer in a substantially vertical direction.

19. The method of claim 18, wherein epitaxially growing the multi-faceted radiation-sensing region comprises:
- epitaxially growing a diamond-shaped multi-faceted radiation-sensing region when the angle is about 30°; and
- epitaxially growing an octahedron-shaped multi-faceted radiation-sensing region when the angle is about 60°.

20. The method of claim 17, wherein depositing the first layer comprises depositing a thickness of the first layer substantially equal to one fourth of a wavelength of an incident radiation divided by the first refractive index, and wherein depositing the second layer comprises depositing a thickness of the second layer substantially equal to one fourth of the wavelength of the incident radiation divided by the second refractive index.

* * * * *